(12) United States Patent
Lin et al.

(10) Patent No.: US 6,880,117 B2
(45) Date of Patent: Apr. 12, 2005

(54) MEMORY DEVICE TEST SYSTEM AND METHOD

(75) Inventors: Wen-Hsi Lin, Hsinchu (TW); Chin-Chung Tseng, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 419 days.

(21) Appl. No.: 10/172,059

(22) Filed: Jun. 14, 2002

(65) Prior Publication Data

US 2003/0233604 A1 Dec. 18, 2003

(51) Int. Cl.⁷ .............................................. G11C 29/00
(52) U.S. Cl. ................................... 714/718; 702/124
(58) Field of Search .................................. 714/718, 736, 714/719, 738, 743, 744; 702/124, 117, 118; 324/527, 528

(56) References Cited

U.S. PATENT DOCUMENTS

| | | | |
|---|---|---|---|
| 5,587,950 A | * 12/1996 | Sawada et al. | 365/201 |
| 6,173,238 B1 | * 1/2001 | Fujisaki | 702/117 |
| 6,243,422 B1 | * 6/2001 | Urabe et al. | 375/259 |
| 6,361,501 B1 | * 3/2002 | Amano et al. | 600/500 |
| 6,543,015 B1 | * 4/2003 | Wang et al. | 714/718 |

* cited by examiner

*Primary Examiner*—Phung My Chung
(74) *Attorney, Agent, or Firm*—Stout, Uxa, Buyan & Mullins, LLP (57) ABSTRACT

A testing system is described for testing a memory device. The testing system includes a timing generator, an optional frequency multiplier circuit, a pattern generator, and a waveform shaping circuit. The timing generator generates a first clock signal. The frequency multiplier circuit receives the first clock signal, and uses the first clock signal to produce a second clock signal. In general, the second clock signal has a frequency greater than a frequency of the first clock signal. The frequency of the second clock signal may twice the frequency of the first clock signal. The testing system provides the second clock signal to the memory device such that operations within the memory device are synchronized to the second clock signal. The waveform shaping circuit produces an address signal synchronized to the first clock signal, and provides the address signal to the memory device when reading data from the memory device. In another embodiment, the first clock signal is not used and the address signals are synchronized to every two cycles of the second clock signal. A method for testing a memory device, which may be embodied in the testing system, is also described.

29 Claims, 6 Drawing Sheets

MEMORY DEVICE TEST SYSTEM AND METHOD

BACKGROUND OF THE INVENTION

1. Field of the Invention

The present invention relates generally to testing apparatuses and, more particularly, to systems for testing memory devices and methods of using the systems.

2. Description of Related Art

Internal operations of synchronous memory devices, such as synchronous mask read only memory (ROM) devices and synchronous dynamic random access memory (SDRAM) devices, are typically synchronized to a single external clock signal. Such a clock signal synchronization feature can eliminates the need to comply with complex timing requirements of multiple timing strobes typical of asynchronous memory devices. In addition, the memory cells of a typical SDRAM device, for example, are arranged in multiple arrays called banks, instead of as a single array. While one of the banks is being accessed, one or more of the other banks may be readied for subsequent access (e.g., signal lines of the one or more other banks may be precharged). This essentially allows the precharge delay time (latency) to be hidden in memory accesses after a first memory access. In addition, the typical SDRAM device has a "burst mode" capability. In burst mode, an address of a first of a number of desired data values (i.e., a first of a "burst length" of data values) is provided to the SDRAM device. The SDRAM device provides the first data value a number of clock cycles later, then provides the data value at the next address during the next clock cycle, and so on, until the device has provided the burst length of data values.

One known method for testing a memory device involves a "data write" portion followed by a "data read and compare" portion. During the data write portion, a clock signal, address signals, control signals, and data signals are provided to the memory device such that the memory device stores data conveyed by the data signals. The data is preferably test patterns capable of detecting a large number of possible defects in the memory device. The control signals direct the memory device to store (i.e., write) the data signals at the provided (corresponding) addresses. In the case of ROM devices, such as mask ROM devices, a data write operation is not required since the memory cells are pre-programmed.

During the subsequent (or initial, for ROMs) "data read and compare" portion, the clock signal, the address signals, and different control signals are provided to the memory device. This time, the control signals direct the memory device to provide the data stored at the provided addresses. After each data read operation, the data provided by the memory device is compared to expected data, i.e., the data provided to the memory device during the data write portion of the test (or the pre-programmed data in the case of a ROM). If the data provided by the memory device does not match the expected data, a fault is detected in the memory device, and the corresponding address, the data provided by the memory device, and/or the expected data is recorded for future analysis.

Some possible defects of memory devices only become apparent (i.e., result in faults) at or near upper operational frequency limits of the devices. For this reason, most memory device manufacturers test their products "at speed," meaning at specified maximum signal (e.g., clock signal) frequencies.

For example, where a synchronous memory device has a specified maximum clock signal frequency of 100 MHz, the synchronous memory device is advantageously tested using a 100 MHz clock signal. Where operations of the synchronous memory device are synchronized to a single transition (e.g., a rising edge transition) of the clock signal, a different address is advantageously provided to the synchronous memory device during each cycle of the 100 MHz clock signal.

The above described test method is typically carried out by a testing machine. Testing machines typically store data used to generate at least parts of the clock signal, the address signals, the control signals and/or data signals in data buffer memories (DBMs). A total storage capacity of such DBMs is typically substantially fixed. As the frequency of the clock signal increases, less and less of the DBM storage capacity is typically available for storing data and assisting with the generation of the clock signal, the address signals, the control signals and/or the data signals.

For example, in one known type of tester used to test synchronous memory devices, a size of a portion of the DBM storage capacity available in connection with the generation of test patterns is inversely proportional to the frequency of the clock signal. In such a tester, the maximum DBM storage density may be 144 Mbits (full density) at a selected clock signal frequency (e.g., minimum cycle rate) below 31.25 MHz. Where the clock signal frequency is between 31.25 MHz and 62.5 MHz, the portion of the DBM storage capacity available in connection with the generation of test patterns is 72 Mbits (half density); and where the selected clock signal frequency is between 62.5 MHz and 125 MHz, the portion of the DBM storage capacity available in connection with the generation of test patterns is 36 Mbits (one quarter density). Thus, a memory device having a storage capacity size of 32 Mbits, and having a maximum clock signal frequency of less than 125 MHz, can be tested "at speed" using the known tester (in a single pass). However, a similar 64 Mbit memory device cannot be tested "at speed" in a single pass.

One solution to the above DBM capacity problem has been to test relatively large capacity memory devices in multiple passes, so that different portions of the relatively large capacity devices are tested until the entire storage capacity of the devices has been tested. This incremental testing process is undesirable in that necessary delays between each testing pass can be cumulative, causing the incremental testing process to take a relatively long time.

A need thus exists in the prior art for testing systems which can attenuate the above-described DBM capacity problem, and for new methods of testing memory devices which can reduce or eliminate the DBM capacity problem.

SUMMARY OF THE INVENTION

A testing system is described for testing a memory device, such as a synchronous memory device. The testing system in accordance with one aspect of the invention includes a timing generator, an optional frequency multiplier circuit, a pattern generator, and a waveform shaping circuit. The timing generator generates a first clock signal; and the frequency multiplier circuit receives the first clock signal, and uses the first clock signal to produce a test clock signal. In general, the test clock signal has a frequency greater than a frequency of the first clock signal. For example, the frequency of the test clock signal may be an integer multiple of the frequency of the first clock signal. The frequency multiplier circuit provides the test clock signal to the memory device such that operations within the memory device are synchronized to the test clock signal. The pattern generator and waveform shaping circuit receive the first clock signal, produce an address signal synchronized to the first clock signal, and provide the address signal to the memory device when writing data to or reading data from the memory device.

In accordance with another aspect of the invention, a timing generator is not used and the testing system is synchronized to every x (e.g., two) cycles of the test clock signal. Address signals are provided to the memory device at a lower frequency (e.g., cycle rate) than the test clock signal. For example, the address signals can be synchronized to every two cycles of the test clock signal. The memory device outputs read data in response to the address signals, wherein the outputted read data is synchronized to the test clock signal.

A method for testing a memory device includes generating a first clock signal, and using the first clock signal to produce a test clock signal having a frequency greater than a frequency of the first clock signal. The test clock signal is provided to the memory device such that operations within the memory device are synchronized to the test clock signal. Test data optionally can be written to the memory device using an address signal synchronized to the first clock signal. In a read operation, data is outputted from the memory device in response to the address signal, wherein the outputted data is synchronized to the test clock signal. Since the read data is outputted from the memory device at the test clock signal rate in response to addresses inputted at the first clock signal rate, multiple (e.g., double) sets of data are outputted. Only one data item for each data set outputted from the memory device is retrieved for analysis for each read operation. The data retrieved from the memory device during the reading is then compared to the test (i.e., expected) data. In accordance with another aspect of the invention, a first clock signal is not generated and the testing system is synchronized to every x (e.g., two) cycles of the test clock signal. Address signals can be synchronized to every two cycles of the test clock signal as well, and the memory device outputs read data synchronized to the test clock signal in response to the address signals.

The inventive testing system can reduce the above-described DBM capacity problem, as can the inventive method for testing a memory device. Relatively large memory devices, which would otherwise require multiple passes to be completely tested, can be tested "at speed" in a single pass. As a result, testing time can be significantly reduced.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of those embodiments as may fall within the spirit and scope of the invention as defined by the appended claims.

Figure 1:
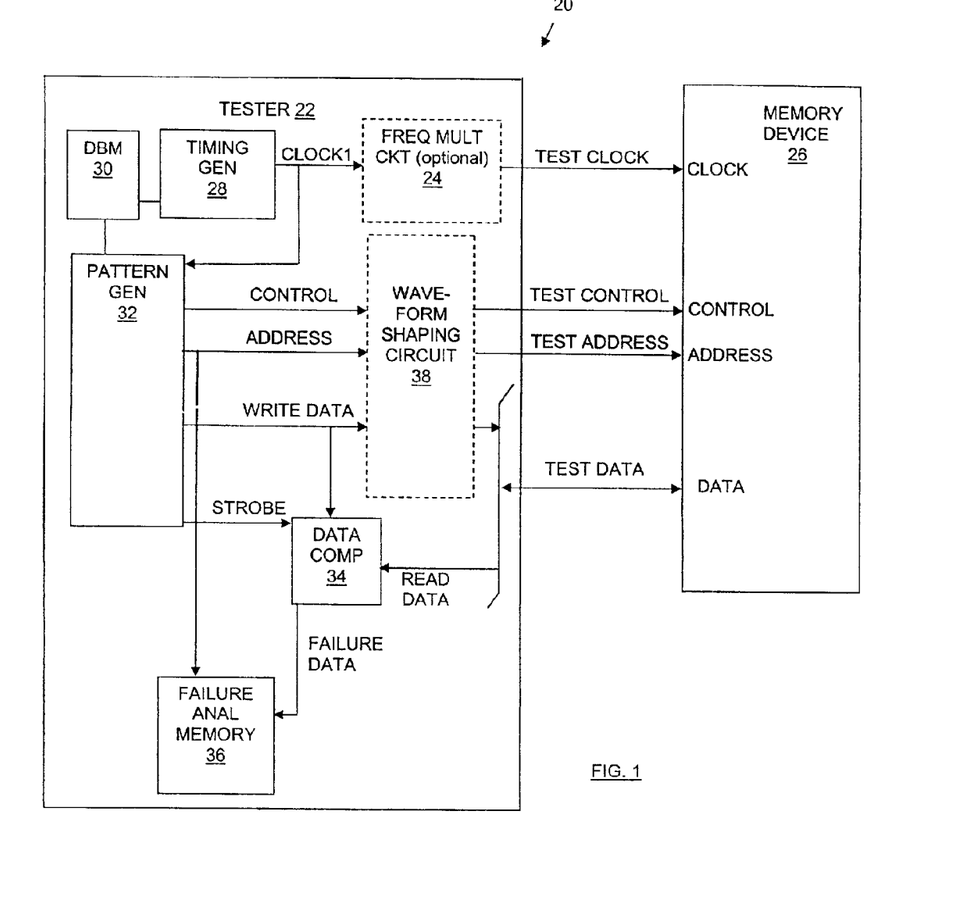
FIG. 1 is a diagram of one embodiment of a testing system for testing a memory device.

Referring more particularly to the drawings, FIG. 1 is a diagram of one embodiment of a testing system 20 applied to a memory device 26 under test. In the embodiment of FIG. 1, the memory device 26 comprises a synchronous memory device. In modified embodiments, however, the memory device 26 may comprise an asynchronous memory device. The testing system 20 includes a testing apparatus (tester) 22 and an optional frequency multiplier circuit 24. As indicated in FIG. 1, the frequency multiplier circuit 24 may be a part of the tester 22 (e.g., a part of a timing generator 28). The tester 22 and the frequency multiplier circuit 24 are shown coupled to the memory device 26. In the illustrated embodiment of FIG. 1, the tester 22 includes the timing generator 28, a data buffer memory (DBM) 30, a pattern generator 32, a data comparator 34, a failure analysis memory 36, and a waveform shaping circuit 38.

As indicated in FIG. 1, the timing generator 28 generates a CLOCK1 signal, and provides the CLOCK1 signal to both the frequency multiplier circuit 24 and the pattern generator 32. A frequency of the CLOCK1 signal is preferably selectable. For example, the timing generator 28 may generate the CLOCK1 signal having a frequency dependent upon a stored value (e.g., a value stored in a configuration register). The stored value may in turn be dependent upon input from a user, or a received signal (e.g., an electrical signal from another device).

As presently embodied, the frequency of a test CLOCK signal is twice the frequency of the CLOCK1 signal. In modified embodiments, the frequency multiplier circuit 24 can be modified or omitted. For example, in an embodiment wherein the frequency multiplier circuit 24 is omitted, the timing generator 28 can be configured to output the CLOCK signal, and the corresponding components of the tester 22 can be programmed/configured to only trigger every x (e.g., 2) cycles of the CLOCK signal. Accordingly, as described herein each description of the CLOCK1 signal (and circuit 24) is to be construed as either: (a) the presence of an actual CLOCK1 signal or (b) a derivation of (e.g., interpretation of) the CLOCK signal that would be functionally similar to a CLOCK1 signal. As an example, when it is stated that an address signal is asserted for a cycle of the CLOCK1 signal, the meaning of this statement is to be interpreted to cover an embodiment wherein the address signal is asserted for a predefined part of the CLOCK signal which would be equivalent to a cycle of the CLOCK1 signal were the CLOCK1 signal to exist. More particularly, in this example the address signal can be interpreted to be asserted for 2 cycles of the CLOCK signal. Other internal functional components of the tester 22 may be modified using circuit design and engineering principles known in the art, so long as, for example, the resulting testing system 20 is able to test a memory device using a timing signal (e.g., test cycle) for the address signal that is greater than a timing signal for the memory device.

The DBM 30 can be used to store, for example, data used by the timing generator 28 to generate the CLOCK1 signal and/or data used by the pattern generator 32 to generate address, control and data signals (e.g., expected data) used to test the memory device 26. Data used by the DBM can comprise, for example, data file(s) downloaded from a tester work station. In one embodiment, a total storage capacity of the DBM 30 is substantially fixed. As the frequency of the CLOCK1 signal increases, less of the DBM 30 storage capacity is available for storing data and assisting with the generation of the CLOCK1 signal, the address signals, the control signals and/or data signals. For example, a size of the portion of the DBM 30 storage capacity available for storing data used by the pattern generator 32 may be inversely proportional to the frequency (e.g., minimum cycle rate) of the CLOCK signal.

During operation of the exemplary testing system 20 of FIG. 1, the timing generator 28 provides a CLOCK1 signal to the frequency multiplier circuit 24. The frequency multiplier circuit 24 uses the CLOCK1 to generate the test CLOCK signal, and provides the CLOCK signal as a timing signal to the memory device 26. In general, the CLOCK signal has a frequency that can be greater than the frequency of the CLOCK1 signal. The frequency of the CLOCK signal is preferably an integer multiple of the frequency of the CLOCK1 signal. That is, n cycles of the CLOCK signal can occur during each cycle of the CLOCK1 signal, where n is an integer multiple. For instance, the frequency of the CLOCK signal may be two times the frequency of the CLOCK1 signal. The frequency multiplier circuit 24 may generate the CLOCK signal dependent upon a stored value (e.g., a value stored in a configuration register). The stored value may in turn be dependent upon input from a user, or a received signal (e.g., an electrical signal from another device).

The CLOCK1 and CLOCK signals may comprise, for example, rectangular waveforms having alternating rising edge transitions and falling edge transitions. In such an embodiment, for every rising edge transition of the lower-frequency CLOCK1 signal, the higher-frequency CLOCK signal has a corresponding rising edge transition that occurs at substantially the same time.

In one embodiment, operations of the testing system 20 include optional "data write" operations and include "data read and compare" operations. During a data write operation, the pattern generator 32 accesses information in the DBM 30, and uses the information to generate address, control, and data signals as described above. The generated signals are then advanced to the waveform shaping circuit 38. In the case of read only memory (ROM) devices, such as a mask ROM device, data write operations may not be required since the memory cells are pre-programmed with the expected data.

The waveform shaping circuit 38 synchronizes the address, control, and data signals to the CLOCK1 signal received from the pattern generator 32, and provides the address, control, and optional data signals to the memory device 26 in the form of a test waveform as indicated in FIG. 1. Following application of the test waveform to the memory device 26, an output DATA signal is generated and transmitted from the memory device 26 to the data comparator 34 (as READ DATA). For instance, if the address signal points to a given area of the memory device 26, then the output DATA. signal can comprise or correspond to the contents stored in that area. In one embodiment, testing and other functions/structure disclosed in U.S. application Ser. No. 10/128,895, entitled Serial Input/Output Testing Method, which is commonly assigned and the contents of which are expressly incorporated herein by reference, are used in connection with the present invention to the extent compatible and not mutually exclusive. Thus, for example, testing operations may be performed in a serial fashion rather than in parallel.

When an address, control, or data signal is synchronized to a clock signal, such as the CLOCK1 signal, the signal is asserted (i.e., made active) when a selected transition or edge of the clock signal occurs. For example, the signal may be asserted on a rising edge transition of the CLOCK1 signal, or on a falling edge transition of the CLOCK1 signal. It is also noted that in the illustrated embodiment address, control, and data signals remain asserted for at least one cycle of the CLOCK1 signal, and change only on the selected transitions of the CLOCK1 signal.

Where the memory device 26 has x bits per address, the pattern generator 32 may generate, for example, x address signals, and the x address signals are conveyed to address terminals of the memory device 26 in the form of a test signal provided by the waveform shaping circuit 38. In the event of a data write operation, the control signals can direct the memory device 26 to program (i.e., write) data conveyed by the data signals at the provided (corresponding) addresses. In the event of a data read and compare operation, the control signals can direct the memory device 26 to read data corresponding to the provided address signals.

It is noted that the memory device 26 may have multiplexed address terminals. In this situation, addresses may be conveyed to the memory device 26 by first conveying a portion of the x address signals (e.g., a row address portion) during one cycle of the CLOCK1 signal, then conveying a remainder of the x address signals (e.g., a column address portion) during a subsequent cycle of the CLOCK1 signal. Thus, all x address signals of an address may not be conveyed to the memory device 26 at the same time (i.e., during the same cycle of the CLOCK1 signal).

For a data write operation, the data to be programmed is preferably a test pattern capable of detecting a relatively large number of possible defects in the memory device 26. For example, test pattern information to be used by the pattern generator 32 and/or the waveform shaping module 38 may be stored in the DBM 30. During each data write operation, the pattern generator 32 may access test pattern information in the DBM 30 corresponding to the address to be provided to the memory device 26, and generate in conjunction with the waveform shaping module 38 data signals that convey the test pattern.

For a "data read and compare" operation, the pattern generator 32 generates address signals and control signals by, for example, accessing data in the DBM 30. In response to the address and control signals provided by the tester 22, the memory device 26 outputs data stored within the memory device 26 at the corresponding address (i.e., read data). The read data signals are provided to the data comparator 34 as indicated in FIG. 1. At the same time, the pattern generator 32 (or, alternatively, the waveform shaping circuit 38) provides "expected data" data to the data comparator 34 along with a STROBE signal as indicated in FIG. 1. For example, the pattern generator 32 may access the test pattern in the DBM 30 corresponding to the address provided to the memory device 26, generate data signals that convey the test pattern, and provide the data signals, conveying the expected data, to the data comparator 34. In another embodiment, the expected data is provided to the data comparator 34 at the same time it is provided to the memory device 26. In response to the STROBE signal, the data comparator 34 compares the read data received from the memory device 26 to the expected data. If the read data is equal to (i.e., matches) the expected data, no fault is detected in the operation of the memory device 26.

On the other hand, if the read data does not match the expected data, a fault is detected in the operation of the memory device 26, and the data comparator provides failure data to the failure analysis memory 36. At the same time the pattern generator 32 provides the expected data to the data comparator 34, the pattern generator 32 can provide the address signals in the failure analysis memory 36 as indicated in FIG. 1. The failure data may include, for example, the read data and/or the expected data. In a preferred embodiment, the failure data includes merely an indication that a failure has occurred. In response to the failure data, the failure analysis memory 36 stores the address conveyed by the address signals, and optionally the failure data. In one embodiment, the failure analysis memory construction and operation is similar to that disclosed in co-pending application Ser. No. 10/177,454, entitled Memory Testing Device and Method, which is commonly assigned and the contents of which are expressly incorporated herein by reference. At a later time, the addresses and failure data may be accessed within the failure analysis memory 36, and analyzed to determine a cause of the failure, and/or away to repair the malfunctioning memory device 26. For example, failed memory cells from the core memory of the memory device 26 may be replaced with memory cells from a peripheral redundant memory of the memory device 26.

Regarding generation of the STROBE signal, the pattern generator 32 may, for example, access data in the DBM 30, and use the data to generate the STROBE signal at an appropriate time, according to, for example, the timing specifications of the memory device 26. For instance, the data in the DBM 30 used in connection with the generation of the STROBE signal may result in the pattern generator 32 generating the STROBE signal a specified minimum period of time after the pattern generator 32 has provided the control signals (to the memory device 26) that direct the memory device 26 to provide the read data.

Figure 2:
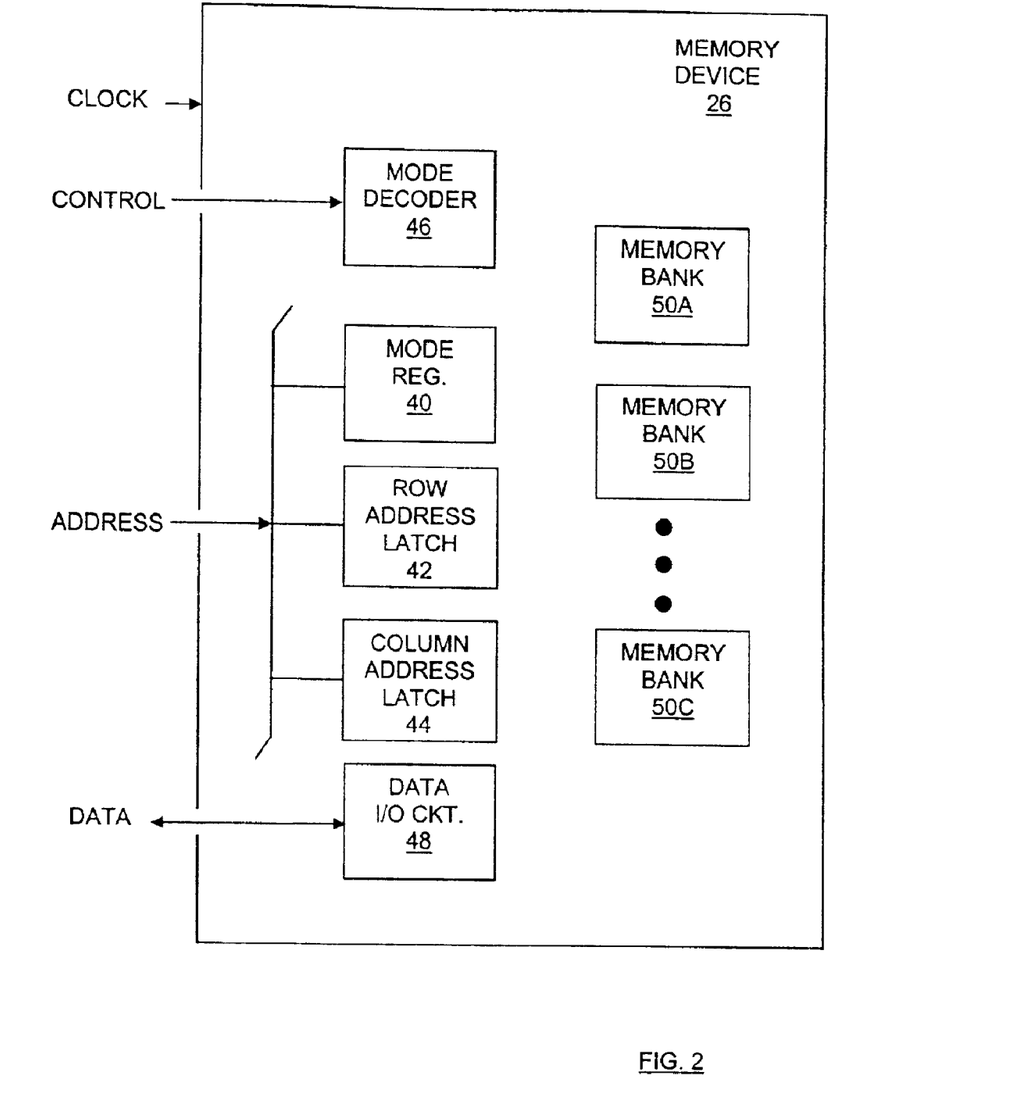
FIG. 2 is a diagram of an exemplary embodiment of the memory device of FIG. 1.

FIG. 2 is a diagram of an exemplary embodiment of the memory device 26 of FIG. 1. In the embodiment of FIG. 2, the memory device 26 comprises a dynamic random access memory device, including a mode register 40, a row address latch 42, a column address latch 44, a mode decoder 46, a data input/output (I/O) circuit 48, and multiple memory banks labeled 50A–50C. In another preferred embodiment, the memory device 26 can comprise a mask ROM device. The memory banks 50A–50C in the illustrated embodiment include memory cells for storing data. Each address, corresponding to multiple memory cells in the memory banks 50A–50C, can include a row address portion, and a column address portion.

In the embodiment of FIG. 2, the address signals provided to the memory device 26 can convey, for example, row address portions of addresses at some times and column address portions of addresses at other times. The control signals may include, for example, a chip select (CS) signal, a write enable (WE) signal, a row address strobe (RAS) signal, a column address strobe (CAS) signal, and a bank address (BA) signal. In other embodiments, the row address portions and column address portions of each address can be conveyed at the same time. The mode decoder 46 receives the control signals, and uses the values of the CS, WE, RAS, and CAS signals to determine which of several predefined commands is specified by the signals. The predefined commands in the embodiment of FIG. 2 can include, for example, an active command, a read command, a write command, and a load_mode command. The BA signal defines which of the memory banks 50A–50C to which a command is directed.

The mode register 40, the row address latch 42, and the column address latch 44 are coupled to receive the address signals received from the tester 22 (FIG. 1). As described above, the address and control signals received by the memory device 26 are synchronized with the CLOCK signal received from the tester 22. The mode register stores configuration data for the memory device 26 (e.g., burst mode and burst length information). When the load_mode command is received, the address signals expectedly convey a mode value to be stored in the mode register.

To read data from one of the memory banks 50A–50C, an active command can be issued to activate the memory bank, followed by a read command. When an active command is received, the row address latch 42 is activated to store the row portion of the address conveyed by the address signals. The row portion of the address is forwarded to the active one of the memory banks 50A–50C indicated by the BA signal. When the subsequent read command is received, the column address latch 42 is activated to store the column portion of the address conveyed by the address signals. The column portion of the address is forwarded to the active memory bank. The data corresponding to the address is then driven on the data signal lines by the data I/O circuit 48.

To write to one of the memory banks 50A–50C, in the illustrated embodiment of FIG. 2, an active command is issued to activate the memory bank, followed by a write command. When an active command is received, the row address latch 42 is activated to store the row portion of the address conveyed by the address signals. The row portion of the address is forwarded to the active one of the memory banks 50A–50C indicated by the BA signal. When the subsequent write command is received, the column address latch 42 is activated to store the column portion of the address conveyed by the address signals, and the data I/O circuit 48 latches the write data received via the data signals. The column portion of the address, and the write data, are forwarded to the active memory bank. The active memory bank stores the write data at the corresponding address.

Figure 3:
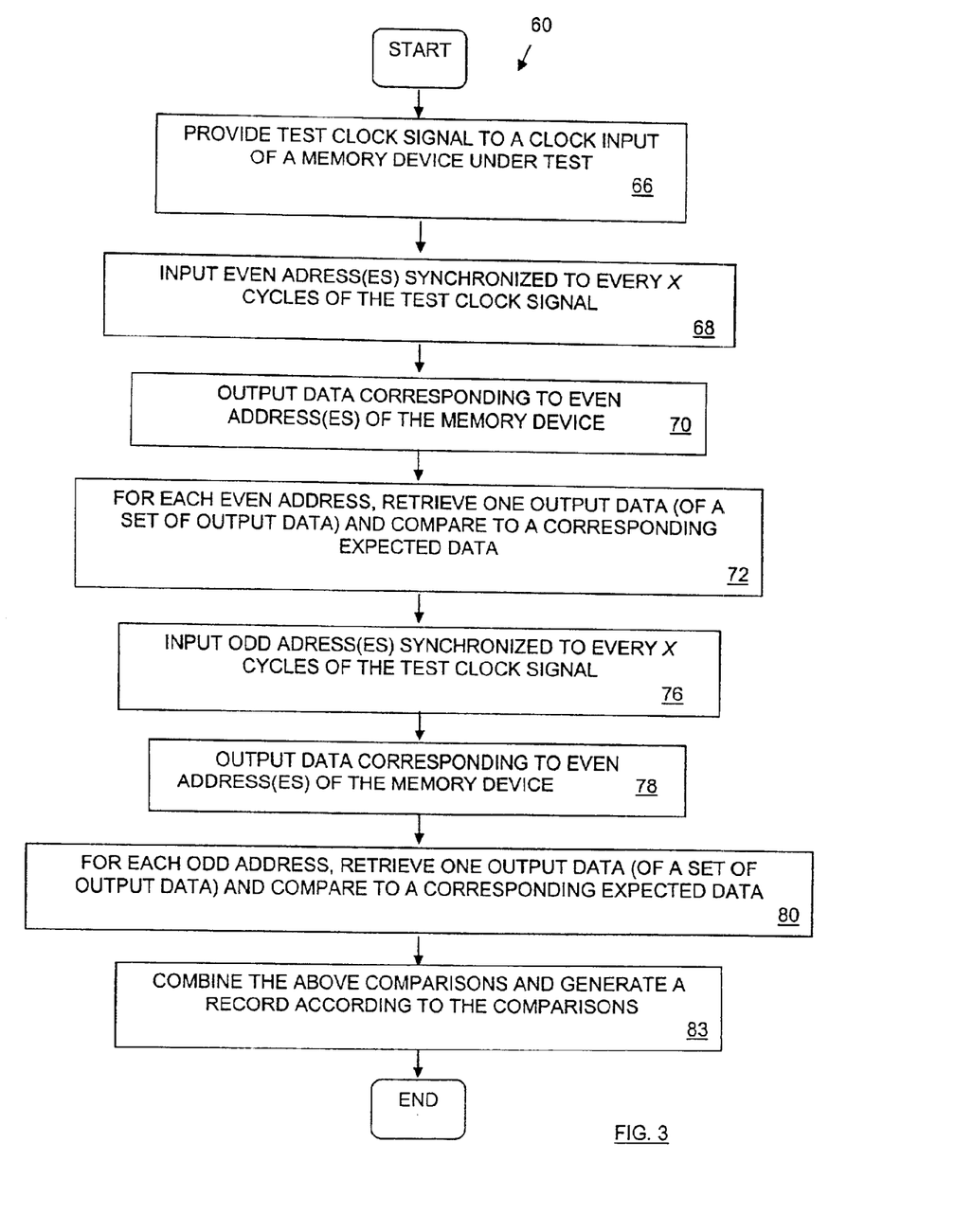
FIG. 3 is a flow chart of a method for testing a memory device.

Referring to FIG. 3, a method 60 for testing the memory device 26 using the test system 20 includes providing 66 the CLOCK signal to the memory device 26 such that processes within the memory device 26 are synchronized to the CLOCK signal. Corresponding operations within the tester 22 can be synchronized to every x (e.g., 2) cycles of the CLOCK signal. The tester 22 then reads data from the memory device 26 using address signals synchronized to every x (e.g., 2) cycles of the CLOCK signal. In particular, the tester 22 inputs to the memory device even address(es) synchronized to every x cycles of the CLOCK signal at 68, followed by the memory device 25 outputting data corresponding to the even address(es) at 70.

Figure 5:
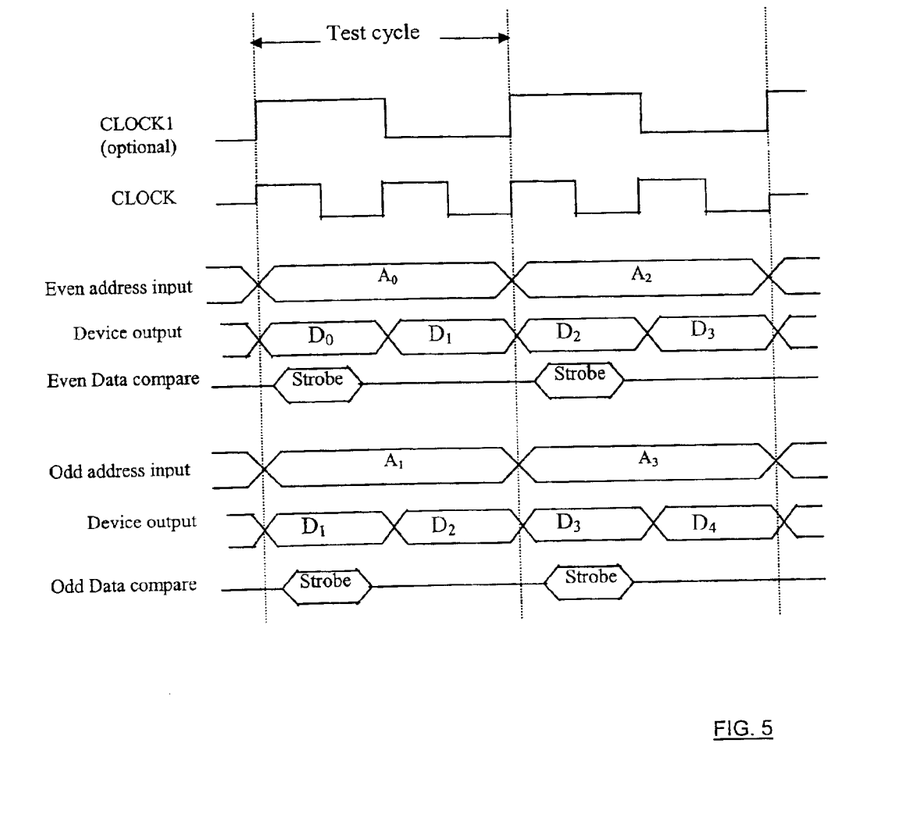
FIG. 5 is a synchronization diagram illustrating synchronization of signals in a particular embodiment of the testing system of the present invention.

For each even address, the memory device 26 outputs x read output datas, since the memory device 26 is synchronized to the CLOCK signal. (See FIG. 5, below.) The tester 22, however, needs only to retrieve one of the output datas from the memory device 26 for each even address, before comparing the retrieved output data with corresponding expected data at 72. Generally speaking, since the address signals are asserted on the address pins of the memory device for x (e.g., 2) cycles of the CLOCK signal, the memory device 26 will output x (e.g., 2) output datas for each address. Since the output datas are staggered as a result of, for example, the even and odd address as shown in FIG. 5, the tester 22 need only read one output data from the memory device for each address. In the illustrated embodiment, x is equal to 2, and the tester 22 reads the first output data (i.e., the odd output data) of the x output datas from the memory device 26, for each even address.

Similarly, the tester 22 then inputs odd address(es) synchronized to every x cycles of the CLOCK signal at 76, followed by the memory device 26 outputting output datas corresponding to each odd address at 78. For each odd address, the tester 22 retrieves one output data (of a set of output data) from the memory device 26 and compares it with corresponding expected data at 80. As with the operation in connection with even addresses, in the illustrated embodiment wherein x is equal to 2 the tester 22 reads the first output data (i.e., the odd output data) for each odd address. An operation 83 is then implemented wherein the above comparisons are combined and a record is generated according to the comparisons.

As a result of, for example, the address signals being asserted for x cycles of the CLOCK signal, the memory device 26 can be operated at a greater speed relative to the tester 22. Since more of the fixed capacity of the DBM 30 (FIG. 1) can be available for data used for example by the pattern generator 32, relatively large capacity memory devices can be tested in a single pass where testing of the devices would otherwise require 2 or more passes.

In accordance with one aspect of the invention, more of the fixed capacity of the DBM 30 (FIG. 1) may be made available for generation of test pattern data and/or forwarding of data signals to the data comparator 34, by reducing, for example, the number of address signals that must be generated by the tester 22. For example, a relatively large memory device 26 expectedly has a large number of address terminals to receive address signals. In a first part of a testing procedure, one of the address signal bits, e.g., a least significant bit (LSB), may be tied to one logical value (e.g., a logic '0'), allowing the pattern generator 32 to provide one less address signal during the first part of the testing procedure wherein even addresses are generated. In a second part of a testing procedure wherein odd address are generated, the least significant bit of the address signal may be tied to the other logical value (e.g., a logic '1'). As a result, less of the DBM 30 storage capacity is needed to store the data used by the pattern generator 32 to generate the address signals, leaving more of the DBM 30 storage capacity available for other operations and/or higher operating speeds.

During the method 60, for example, an address signal line conveying a least significant bit (i.e., bit '0') of the address signals is connected (i.e., "tied") to a logic '0' during a first part of a testing procedure, then tied to a logic '1' during a second part of the testing procedure. The other address signals are generated by the tester 22 during both parts of the testing procedure, and provided to the memory device 26. As a result, even addresses of the memory device are tested during a first part of a testing procedure, and odd addresses are tested during a second part of the testing procedure.

Figure 4A:
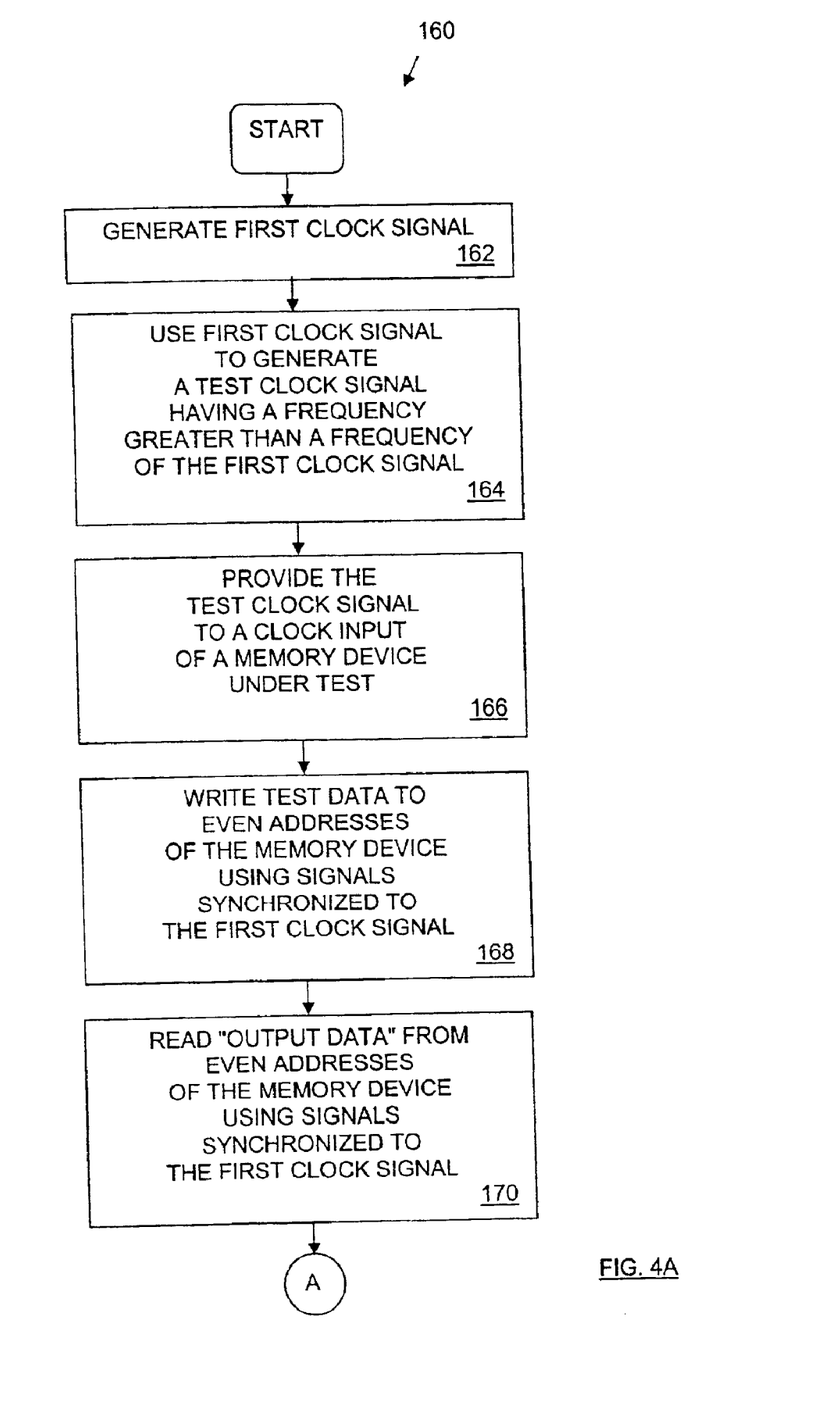
FIGS. 4A and 4B in combination form a flow chart of another method for testing a memory device.
Figure 4B:
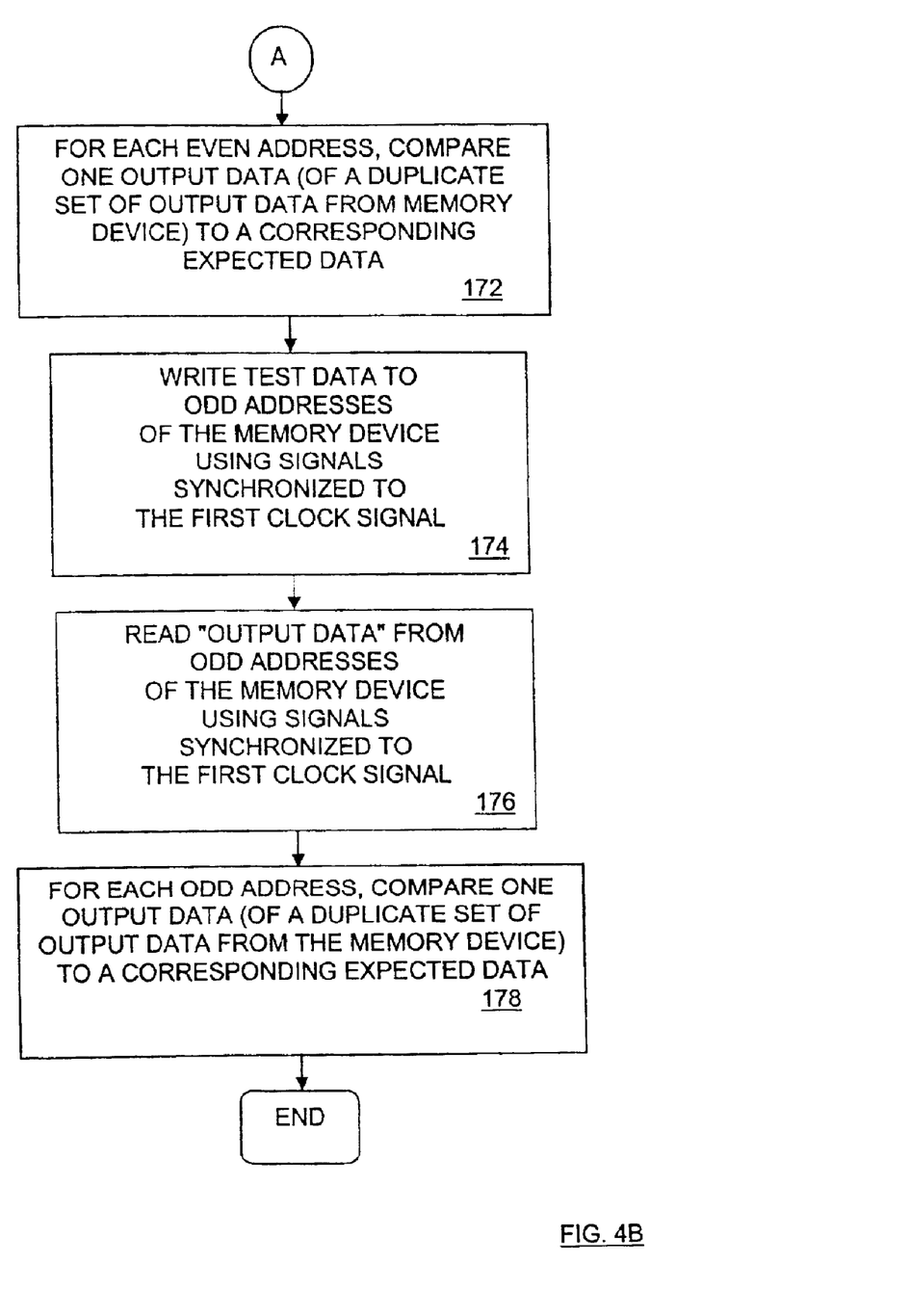

Referring to the embodiment elucidated in FIGS. 4A and 4B, during an operation 162 of the method 160, a first clock signal is generated (e.g., the CLOCK1 signal of FIG. 1), and the first clock signal is used to produce a second (test) clock signal having a frequency greater than a frequency of the first clock signal during an operation 164 (e.g., the CLOCK signal of FIG. 1). During an operation 166, the test clock signal is provided to a memory device (under test) such that operations within the memory device are synchronized to the test clock signal. For example, in FIG. 1, the CLOCK signal is provided to the memory device 26 such that operations within the memory device 26 are synchronized to the CLOCK signal.

During an operation 168, test data is written to even addresses of the memory device using control, data, and address signals synchronized for example to the first clock signal. One or more of the signals can instead be synchronized to the test clock signal in modified embodiments. As described above, the even addresses may be generated by tying the least significant bit (i.e., bit '0') of the address signals to a logic '0', and generating address signals on the remaining address lines until all desired even addresses within the address space of the memory device have been generated. This technique may also be used, for example, with the method of FIG. 3. It is noted that a memory device having x bits per address, and x corresponding address signals per address, can have an address space including all $2^x$ possible logical combinations of the x address signals. In response to the address, data, and control signals, the memory device may store the test data within the memory device at the denoted even addresses.

During an operation 170, data is read from even addresses of the memory device using signals synchronized to the first clock signal. With the address signal line conveying the least significant bit of the address signals still tied to a logic '0', the logical combinations of the remaining address signals are generated until all desired even address signals within the address space of the memory device have been generated. The reading operation and a comparing operation are performed substantially as described in connection with FIG. 3.

Data read from the memory device during the operation 170 is compared at 172 to the corresponding test data (i.e., expected data). For example, a data read and compare operation may be performed for each even address in the address space of the memory device. During each of the data read and compare operations, address and control signals may be synchronized to the first clock signal (e.g., the CLOCK1 signal of FIG. 1), and provided to the memory device. The control signals may direct the memory device to provide stored data at the denoted address. In response to the address, data, and control signals, the memory device may provide data stored within the memory device at the address. As each address is provided to the memory device, and the data stored within the memory device at the address is retrieved, the data retrieved from the memory device may be compared to the corresponding test data as described above. As with the method of FIG. 3, the address signals are asserted on the address pins of the memory device for x (e.g., 2) cycles of the CLOCK signal, so that the memory device 26 outputs x (e.g., 2) sets of output data for each address. In the illustrated embodiment, the tester 22 reads (i.e., retrieves) only one (e.g., the first or the odd) output data of the x output datas from the memory device 26, for each even address.

During an operation 174, test data is written to all desired odd addresses of the memory device using signals synchronized to, for example, the first clock signal. As described above, this may be accomplished by tying the least significant bit of the address signals to a logic '1', and generating address signals on the remaining address lines until all desired odd address signals within the address space of the memory device have been generated. During an operation 176, data is read from all desired odd addresses of the memory device using signals synchronized to the first clock signal. With the address signal line conveying the least significant bit of the address signals still tied to a logic '1', the logical combinations of the remaining address signals are generated until all desired even address signals within the address space of the memory device have been generated. During an operation 178, data retrieved from the memory device during the operation 176 is compared to the corresponding test data (i.e., expected data). Operations for the odd addresses are performed substantially the same as the above-described operations for the even addresses.

In modified embodiments, test data is optionally written to all (i.e., even and odd) desired addresses of the memory device using signals synchronized to the first clock signal (or to every x cycles of the test clock signal), and data is read from all of the desired addresses of the memory device using signals synchronized to the first clock signal (or to every x cycles of the test clock signal). Thus, as each consecutive address is provided to the memory device, and the data stored within the memory device at the address is retrieved, the selected data retrieved from the memory device is compared to the corresponding test data as described above.

FIG. 5 is a synchronization diagram illustrating synchronization of signals in a particular embodiment of the testing system 20, wherein the testing system 20 embodies the test methods 60 or 160 of FIG. 3 or FIGS. 4A and 4B, respectively. In the embodiment of FIG. 5, the CLOCK signal produced by the frequency multiplier circuit 24 (FIG. 1) is twice the frequency of the CLOCK1 signal produced by the timing generator 28. Alternatively, the CLOCK signal may exist in the absence of the frequency multiplier circuit 24. For each address all address signals of that address are conveyed from the waveform shaping circuit 38 to the memory device 26 at the same time (i.e., during the same cycle of the CLOCK1 signal, or during the same x cycles of the CLOCK signal).

As presently embodied, the test cycle time is one cycle (i.e., one period) of the CLOCK1 signal, and two cycles (i.e., two periods) of the CLOCK signal, as indicted in FIG. 5. It is noted that in FIG. 5, for every rising edge transition of the lower-frequency CLOCK1 signal, the higher-frequency CLOCK signal has a corresponding rising edge transition that occurs at substantially the same time. An upper portion of FIG. 5 illustrates signal synchronizations during a data read and compare operation carried out during the first part of the method 160 of for example FIG. 3, wherein test data is read from even addresses of the memory device 26 using signals synchronized to every x (e.g., 2) cycles of the CLOCK signal. The method of FIG. 3 can be used to test a ROM device and, accordingly, test data may not be written in that testing process. As indicted in the upper portion of FIG. 5, even address signals $A_0$ and $A_2$ asserted by the waveform shaping circuit 38 are synchronized to the every x cycles of the CLOCK signal. FIG. 5 shows each of the address signals being asserted during one cycle of the CLOCK1 signal and during two cycles of the CLOCK signal.

The operations of the memory device 26 are synchronized to the higher-frequency CLOCK signal. For this reason, the memory device 26 responds to the $A_0$ signal by providing data $D_0$ and $D_1$ during two corresponding (e.g., consecutive) cycles of the CLOCK signal, and responds to the $A_2$ signal by providing data $D_2$ and $D_3$ during another two corresponding cycles of the CLOCK signal. Thus, the memory device outputs the read data synchronized with every cycle of the CLOCK signal.

It is noted that FIG. 5 is not a timing diagram. For example, expected delays between the providing of even address signals $A_0$ and $A_2$ to the memory device 26, and the obtaining of the respective corresponding data $D_0$ and $D_1$, and $D_2$ and $D_3$ from the memory device 26, are not indicated in FIG. 5.

In the embodiment of FIG. 5, the pattern generator 32 (FIG. 1) provides a STROBE signal to the data comparator 34 (FIG. 1) during a first of the two corresponding cycles that the memory device 26 provides data Do and $D_1$ to the data comparator 34. In response to the STROBE signal, the data comparator 34 compares the data $D_0$ received from the memory device 26 to the expected data as described above. Similarly, the pattern generator 32 (FIG. 1) provides a STROBE signal to the data comparator 34 (FIG. 1) during a first of the two corresponding cycles that the memory device 26 provides data $D_2$ and $D_3$ to the data comparator 34. In response to the STROBE signal, the data comparator 34 compares the data $D_2$ received from the memory device 26 to the expected data.

While the providing of the STROBE signal to the data comparator 34 during a first of multiple corresponding cycles that the memory device 26 provides data is an aspect of "at speed" testing, it is noted that the pattern generator 32 may provide the STROBE signal to the data comparator 34 during any of the multiple corresponding cycles that the memory device 26 provides data to the data comparator 34.

A lower portion of FIG. 5 illustrates signal synchronizations during a data read and compare operation carried out during the second part of the method 60 of for example FIG. 3 (or alternatively, as above, of FIGS. 4A and 4B), wherein test data is read from all desired odd addresses of the memory device 26 using signals synchronized as described above. Accordingly, odd address signals $A_1$ and $A_3$ produced by the tester 22 are synchronized similarly to that described above, wherein each of the address signals is asserted for one cycle of the CLOCK 1 signal and for two cycles of the CLOCK signal. For reasons described above, the memory device 26 responds to the $A_1$ signal by providing data $D_1$ and $D_2$ during two corresponding cycles of the CLOCK signal, and responds to the $A_3$ signal by providing data $D_3$ and $D_4$ during another two corresponding cycles of the CLOCK signal. As described above, the pattern generator 32 (FIG. 1) provides a STROBE signal to the data comparator 34 (FIG. 1) during a first of the two corresponding cycles that the memory device 26 provides data D1, and later $D_3$, to the data comparator 34. In response to the STROBE signal, the data comparator 34 compares the data $D_1$, and later data $D_3$, received from the memory device 26 to the expected data as described above.

When the present invention is added to an existing tester having a data buffer memory (DBM) storage capacity of 36 Mbits at a given clock signal frequency between 62.5 MHz and 125 MHz, and the testing method 60 of for example FIG. 3 is employed, the DBM storage capacity of the tester can be doubled at the same given frequency. Thus, the limitation of DBM capacity for a one-insertion testing procedure can be 72 Mbits for clock signal frequencies between 62.5 MHz and 125 MHz, 144 Mbits for clock signal frequencies between 31.25 MHz and 62.5 MHz, and 288 Mbits for clock signal frequencies less than 31.25 MHz. In addition, the testing system of the present invention can have a limitation of DBM capacity in one-insertion that is 36 Mbits for clock frequencies between 125 MHz and 250 MHz. Without the above modifications of the present invention, a memory device having a specified maximum clock frequency of 100 MHz, and a storage capacity of 64 Mbits could not be tested "at speed" in a single pass. However, with the above modifications, it is possible to test the memory device "at speed" in a single pass. As a result, testing time can be significantly reduced and the testing ability of a testing system can be increased.

The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A testing system comprising:
   a timing generator constructed to generate a clock signal that is to be provided as an input timing signal to a memory device under test;
   a pattern generator configured to produce an address signal; and
   a waveform shaping circuit operatively coupled to the pattern generator, the waveform shaping circuit being constructed to receive the address signal from the pattern generator and to provide the address signal to the memory device synchronized to every x cycles of the clock signal wherein x is greater than 1:
   wherein during a data read and compare generator, the pattern generator and the waveform shaping circuit are configured to: (i) produce a control signal, a strobe signal, and expected data, wherein the control signal directs the memory device to provide stored data at an address specified by the address signal, and (ii) provide the control signal to the memory device along with the address signal;
   wherein the wave form shaping circuit provides the address signal to the memory device for x cycles of the clock signal;
   wherein the testing system produces the strobe signal during only one cycle of the x cycles of the clock signal;
   wherein x is an integer; and
   wherein the testing system is configured to first perform the read and compare operation for even addresses in an address space of the memory device, and to then perform the read and compare operation for odd addresses in the address space of the memory device.

2. A testing system comprising:
   a timing generator constructed to generate a clock signal that is to be provided as an input timing signal to a memory device under test;
   a pattern generator configured to produce an address signal; and
   a waveform shaping circuit operatively coupled to the pattern generator, the waveform shaping circuit being constructed to receive the address signal from the pattern generator and to provide the address signal to the memory device synchronized to every x cycles of the clock signal wherein x is greater than 1:
   wherein x is equal to 2;
   wherein the clock signal comprises rising edge transition or a falling transition;
   wherein the clock signal is asserted or either a rising edge transition or a falling edge transition of the clock signal; and
   wherein the address signal remains asserted for two cycles of the clock signal after being asserted.

3. The testing system as recited in claim 2, wherein during a data read and compare operation, the pattern generator and the waveform shaping circuit are configured to: (i) produce a control signal, a strobe signal, and expected data, wherein the control signal directs the memory device to provide stored data at an address specified by the address signal, and (ii) provide the control signal to the memory device along with the address signal.

4. The testing system as recited in claim 3, wherein the pattern generator provides the address signal to the memory device for two cycles of the second clock signal, and wherein the testing system produces the strobe signal during only one cycle of the 2 cycles of the clock signal.

5. The testing system as recited in claim 4, further comprising:
   a data comparator coupled to receive data from the memory device, the expected data, and the strobe signal, and configured to respond to the strobe signal by comparing the data received from the memory device and the expected data, and to produce failure data if the data received from the memory device is not equal to the expected data; and
   a failure analysis memory coupled to receive the address signal produced by the pattern generator and the failure data produced by the data comparator, wherein the failure analysis memory is configured to respond to the failure data by storing an address conveyed by the address signal.

6. A testing system, comprising:
   a timing generator constructed to generate a first clock signal;
   a frequency multiplier circuit coupled to receive the first clock signal and configured to produce a second clock signal having a frequency greater than a frequency of the first clock signal, and to provide the second clock signal to a memory device;
   a pattern generator coupled to receive the first clock signal and to produce an address signal; and
   a waveform shaping circuit operatively coupled to the pattern generator, the waveform shaping circuit being constructed to receive the address signal from the pattern generator and to provide the address signal to the memory device synchronized to the first clock signal.

7. The testing system as recited in claim 6, wherein the frequency of the second clock signal is an integer multiple of the frequency of the first clock signal.

8. The testing system as recited in claim 6, wherein operations within the memory device are synchronized to the second clock signal.

9. The testing system as recited in claim 6, wherein the waveform shaping circuit provides the address signal to the memory device for one cycle of the first clock signal, and for more than one cycle of the second clock signal.

10. The testing system as recited in claim 6, wherein the first clock signal comprises rising edge transitions and falling edge transitions, and wherein the address signal is asserted on either a rising edge transition or a falling edge transition of the first clock signal, and wherein the address signal remains asserted for at least one cycle of the first clock signal after being asserted.

11. The testing system as recited in claim 6, wherein during a data write operation, the pattern generator and the waveform shaping circuit are configured to: (i) produce a control signal and a data signal synchronized to the first clock signal, wherein the control signal directs the memory device to store the data at an address specified by the address signal, and (ii) provide the control and data signals to the memory device along with the address signal.

12. The testing system as recited in claim 13, further comprising:
a data comparator coupled to receive data from the memory device, and the expected data and the strobe signal, and configured to respond to the strobe signal by comparing the data received from the memory device and the expected data, and to produce failure data if the data received from the memory device is not equal to the expected data; and
a failure analysis memory coupled to receive the address signal produced by the pattern generator and the failure data produced by the data comparator, wherein the failure analysis memory is configured to respond to the failure data by storing an address conveyed by the address signal.

13. The testing system as recited in claim 6, wherein during a data read and compare operation, the pattern generator and the waveform shaping circuit are configured to: (i) produce a control signal, a strobe signal, and expected data, wherein the control signal directs the memory device to provide stored data at an address specified by the address signal, and (ii) provide the control signal to the memory device along with the address signal.

14. The testing system as recited in claim 13, wherein the waveform shaping circuit provides the address signal to the memory device for more than one cycle of the second clock signal, and wherein the testing system produces the strobe signal during a first cycle of the more than one cycle of the second clock signal.

15. The testing system as recited in claim 14, wherein the tester is configured to first perform the data read and compare operation for even addresses in an address space of the memory device, and to then perform the data read and compare operation for odd addresses in the address space of the memory device.

16. A method for testing a memory device, comprising:
providing a clock signal to a memory device such that operation within the memory device are synchronized to the clock signal;
reading the data from the memory device using an address signal synchronized to every x cycles of the clock signal wherein x is greater than 1; and
comparing the data read from the memory device to test data;
wherein the providing comprises generating a clock signal having rising edge transitions and falling edge transitions; and
wherein the reading is preceded with writing test data to the memory device using the address signal, the address signal being asserted on either a rising edge transition or a falling edge transition of the first clock signal, and remaining asserted for at least one x cycles of the first clock signal alter being asserted.

17. The method as recited in claim 16, wherein the writing comprises providing the address signal, and test data corresponding to the address signal, to the memory device during an operation to store the test data within the memory device at an address corresponding to the address signal, wherein the address signal is synchronized to every x cycles of the clock signal.

18. A method for testing a memory device comprising:
providing a clock signal to a memory device such that operation within the memory device are synchronized to the clock signal;
reading the data from the memory device using an address signal synchronized to every x cycles of the clock signal wherein x is greater than 1; and
comparing the data read from the memory device to test data;
wherein the reading comprises providing the address signal to the memory device during the operation to retrieve data stored within the memory device at an address corresponding to the address signal, the address signal being provided to the memory device for x cycles of the clock signal; and
wherein the comparing comprises producing a strobe signal during only one cycle of the x cycles of the clock signal, to thereby acquire data from the memory device.

19. The method as recited in claim 18, wherein the address signal is provided to the memory device for 2 cycles of the clock signal, and wherein the strobe signal is produced for only one cycle of the 2 cycles of the clock signal.

20. A method for testing a memory device, comprising:
using a first clock signal to produce a second clock signal having a frequency greater than a frequency of the first clock signal;
providing the second clock signal to the memory device such that operations within the memory device are synchronized to the second clock signal;
reading data from the memory device using an address signal synchronized to the first clock signal; and
comparing the data retrieved from the memory device during the reading to the test data.

21. The method as recited in claim 20, wherein the using comprises using the first clock signal to produce a second clock signal having a frequency that is an integer multiple of the first clock signal.

22. The method as recited in claim 20, wherein:
the using comprises generating a first clock signal having rising edge transitions and falling edge transitions; and
the reading is preceded with writing test data to the memory device using the address signal, the address signal being asserted on either a rising edge transition or a falling edge transition of the first clock signal, and remaining asserted for at least one cycle of the first clock signal after being asserted.

23. The method as recited in claim 22, wherein the writing comprises providing an address signal, and test data corresponding to the address signal, to the memory device during an operation to store the test data within the memory device at an address corresponding to the address signal, wherein the address signal is synchronized to the first clock signal.

24. The method as recited in claim 20, wherein:
the reading comprises providing the address signal to the memory device during an operation to retrieve data stored within the memory device at an address corresponding to the address signal, the address signal being provided to the memory device for more than one cycle of the second clock signal; and
the comparing comprises producing a strobe signal during only a first cycle of the more than one cycle of the second clock signal, to thereby acquire data from the memory device.

25. A method for testing a memory device, comprising:
providing a clock into the memory device;

inputting an address into the memory device, each address being synchronized with every two cycles of the clock;

outputting an output data from the memory device according to the address, the output data being synchronized with every cycle of the clock;

retrieving odd or even, but not both, of the output data; and comparing the retrieved output data with corresponding even of a standard data.

26. The method of claim 25, wherein the inputting comprises inputting an even address, the outputting comprises outputting a first data output from the memory device, the retrieving comprises retrieving odd of the first output data, and the comparing further comprises comparing the odd of the first output data with even of a standard data; and wherein the method further comprises:

inputting an odd address into the memory device, each odd address being synchronized with every two cycles of the clock;

outputting a second output data from the memory device according to the odd address, the second output data being synchronized with every cycle of the clock;

retrieving odd of the second output data; and comparing the odd of the second output data with corresponding odd of the standard data.

27. The method of claim 26, further comprising generating a record of comparisons of the odd of the first output data with even of the standard data and the odd of the second output data with odd of the standard data.

28. A method for testing a memory device, comprising:

generating a first clock signal;

using the first clock signal to produce a second clock signal having a frequency greater than a frequency of the first clock signal;

providing the second clock signal to a memory device such that operations within the memory device are synchronized to the second clock signal;

performing a read and compare operation for each of the even addresses in the address space of the memory device, wherein each read and compare operation comprises (i) providing an address signal to the memory device to retrieve data stored within the memory device at the address wherein the address signal is synchronized to the first clock signal, and (ii) comparing the retrieved data to the test data;

performing a read and compare operation for each of the odd addresses in the address space of the memory device, wherein each read and compare operation comprises (i) providing an address signal to the memory device to retrieve data stored within the memory device at the address, wherein the address signal is synchronized to the first clock signal, and (ii) comparing the retrieved data to the test data.

29. The method as recited in claim 28, wherein:

the performing of a read and compare operation for each of the even addresses is preceded by a step of performing a write operation for each even address in an address space of the memory device, wherein each even-address write operation comprises providing an even address signal and test data corresponding to the even address signal to the memory device to store the test data within the memory device at an address corresponding to the even address signal, and wherein the even address signal is synchronized to the first clock signal; and the performing of a read and compare operation for each of the odd addresses is preceded by a step of performing a write operation for each odd address in an address space of the memory device, wherein each odd-address write operation comprises providing an odd address signal and test data corresponding to the odd address signal to the memory device to store the test data within the memory device at an address corresponding to the odd address signal, and wherein the odd address signal is synchronized to the first clock signal.

* * * * *